(12) United States Patent
Okabe et al.

(10) Patent No.: US 7,547,003 B2
(45) Date of Patent: Jun. 16, 2009

(54) VAPORIZING APPARATUS AND SEMICONDUCTOR PROCESSING SYSTEM

(75) Inventors: Tsuneyuki Okabe, Oshu (JP); Shigeyuki Okura, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 116 days.

(21) Appl. No.: 11/892,662

(22) Filed: Aug. 24, 2007

(65) Prior Publication Data

US 2008/0296791 A1 Dec. 4, 2008

(30) Foreign Application Priority Data

Aug. 31, 2006 (JP) ............................ 2006-236820

(51) Int. Cl.
*B01F 3/04* (2006.01)

(52) U.S. Cl. .................. 261/78.2; 96/224; 118/726; 261/138; 261/139; 261/142; 261/DIG. 65; 422/121

(58) Field of Classification Search .............. 261/78.2, 261/138, 139, 141–143, DIG. 65; 96/224; 118/715, 720, 726; 422/24, 121
See application file for complete search history.

(56) References Cited

U.S. PATENT DOCUMENTS

| | | | | |
|---|---|---|---|---|
| 2,638,644 A | * | 5/1953 | Rauhut | ...................... 96/142 |
| 4,060,576 A | * | 11/1977 | Grant | ...................... 261/130 |
| 4,419,302 A | * | 12/1983 | Nishino et al. | ............... 261/142 |
| 4,618,462 A | * | 10/1986 | Fisher | ...................... 261/130 |
| 5,536,323 A | * | 7/1996 | Kirlin et al. | .................. 118/726 |
| 5,589,132 A | * | 12/1996 | Zippel | ........................ 422/24 |
| 6,789,789 B2 | * | 9/2004 | Randive et al. | ............. 261/133 |
| 7,422,198 B2 | * | 9/2008 | Yoshioka et al. | ............. 261/130 |
| 7,472,896 B1 | * | 1/2009 | Tsai | ........................... 261/142 |
| 2006/0125129 A1 | * | 6/2006 | Takamatsu et al. | .......... 261/142 |

FOREIGN PATENT DOCUMENTS

| | | | | |
|---|---|---|---|---|
| JP | 54-98034 A | * | 8/1979 | .......... 261/DIG. 65 |
| JP | 2004-211183 | | 7/2004 | |

* cited by examiner

*Primary Examiner*—Richard L Chiesa
(74) *Attorney, Agent, or Firm*—Smith, Gambrell & Russell, LLP

(57) ABSTRACT

A vaporizing apparatus for generating a process gas from a liquid material includes a vaporizing container defining a vaporizing space of the vaporizing apparatus; an injector connected to the vaporizing container to spray the liquid material in an atomized state into the vaporizing space; and a heater attached to the vaporizing container to heat the liquid material sprayed in the vaporizing space. The vaporizing apparatus further includes a gas delivery passage connected to the vaporizing container to output from the vaporizing space a generation gas generated from the liquid material; a filter disposed inside the gas delivery passage or between the gas delivery passage and the vaporizing space to trap mist contained in the generation gas; and an infrared irradiation mechanism configured to irradiate the filter with infrared rays.

20 Claims, 8 Drawing Sheets

VAPORIZING APPARATUS AND SEMICONDUCTOR PROCESSING SYSTEM

BACKGROUND OF THE INVENTION

1. Field of the Invention

The present invention relates to a vaporizing apparatus for generating a process gas from a liquid material, and a semiconductor processing system. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an FPD (Flat Panel Display), e.g., an LCD (Liquid Crystal Display), by forming semiconductor layers, insulating layers, and conductive layers in predetermined patterns on the target substrate.

2. Description of the Related Art

A film formation process for forming a predetermined film on the surface of a semiconductor wafer is performed in manufacturing semiconductor devices. For example, a process of this kind is performed, using a low-pressure CVD (Chemical Vapor Deposition) apparatus. In low-pressure CVD apparatuses, a source material is supplied in a gaseous state to promote a chemical reaction, thereby depositing a thin film on the surface of a wafer. In apparatuses of this kind, there is a case where a process gas is generated by vaporizing a liquid material, and is supplied into a process chamber as a film formation gas.

Examples of a film formation process using a process gas generated by vaporizing a liquid material are as follows. Specifically, a process gas generated by vaporizing TEOS ($Si(OC_2HO_5)_4$: tetraethoxysilane) and oxygen ($O_2$) gas are used to form an $SiO_2$ film. A process gas generated by vaporizing hexachlorodisilane ($Si_2Cl_6$) and ammonia ($NH_3$) gas are used to form a silicon nitride ($Si_3N_4$) film.

Further, in some processes, a metal-organic compound (complex compound) is used to form a film of this metal. Examples of a film formation process of this type are as follows. Specifically, a process gas generated by vaporizing a hafnium-containing liquid material and oxygen gas are used to form a hafnium oxide film. Process gases generated by vaporizing liquid materials containing titanium (Ti), strontium (Sr), and barium (Ba) and oxygen gas are used to form a BST (barium strontium titanium) oxide film.

Conventionally, where a liquid material having a high vapor pressure, such as TEOS, is used, in-liquid particles contained in the liquid material (about 3,000/ml) are vaporized by a baking method. In this case, only vapor is supplied into a process chamber, while the in-liquid particles are left in the liquid material stored in the heating vessel. However, a liquid material having a low vapor pressure, such as a hafnium-containing material, is difficult to vaporize by a baking method, because the gas thereof has a low decomposition temperature. Further, the liquid material is stored for a long time in a tank set at a high temperature, and is thereby denatured. Accordingly, in order to promote vaporization of a liquid material, a spray type is used such that the liquid material is supplied along with a carrier gas in an atomized state from an injector into a vaporizing chamber heated to a predetermined temperature. However, in this case, since in-liquid particles are sent to the injector, a filter for trapping particles is required inside the vaporizing chamber.

Further, because of diversification in the design of semiconductor devices, various metal organic compounds have come into use as liquid materials. For example, an organic compound of Hf, Zr, or St has a low vapor pressure that is less than 1/10 of that of TEOS. Where a liquid material having such a low vapor pressure is used, the liquid material cannot be vaporized well, so a non-vaporized component (mist) inevitably remains. If a process gas contains mist, particles may be deposited on a wafer. Accordingly, it is necessary to dispose a filter near the outlet of a vaporizer or in a gas supply passage.

In general, such a filter is fixed by a fixing member on a container for forming the vaporizing chamber of a vaporizer. The filter is heated from around through the fixing member by a heater built in the container. Patent Document 1 (Jpn. Pat. Appln. KOKAI Publication No. 2004-211183 (paragraph 0012 and FIG. 2)) discloses, a vaporizer including a filter disposed to cover an outlet port formed in a sidewall of a chamber body. This filter is fixed by bolts on the chamber body so that the backside thereof is in close contact with a wall surface. This filter is heated by a heater disposed on the chamber body near the wall surface on which the filter is attached.

BRIEF SUMMARY OF THE INVENTION

An object of the present invention is to provide a vaporizing apparatus that can reliably perform vaporization for a long time, and a semiconductor processing system including this vaporizing apparatus.

According to a first aspect of the present invention, there is provided a vaporizing apparatus for generating a process gas from a liquid material, the apparatus comprising: a vaporizing container defining a vaporizing space of the vaporizing apparatus; an injector connected to the vaporizing container to spray the liquid material in an atomized state into the vaporizing space; a heater attached to the vaporizing container to heat the liquid material sprayed in the vaporizing space; a gas delivery passage connected to the vaporizing container to output from the vaporizing space a generation gas generated from the liquid material; a filter disposed inside the gas delivery passage or between the gas delivery passage and the vaporizing space to trap mist contained in the generation gas; and an infrared irradiation mechanism configured to irradiate the filter with infrared rays.

According to a second aspect of the present invention, there is provided a semiconductor processing system comprising: a process chamber configured to accommodate a target substrate; a support member configured to support the target substrate inside the process chamber; a heater configured to heat the target substrate inside the process chamber; an exhaust system configured to exhaust gas from inside the process chamber; and a gas supply section configured to supply a process gas into the process chamber, and including a vaporizing apparatus for generating the process gas from a liquid material, wherein the vaporizing apparatus comprises a vaporizing container defining a vaporizing space of the vaporizing apparatus, an injector connected to the vaporizing container to spray the liquid material in an atomized state into the vaporizing space, a heater attached to the vaporizing container to heat the liquid material sprayed in the vaporizing space, a gas delivery passage connected to the vaporizing container to output from the vaporizing space a generation gas generated from the liquid material, a filter disposed inside the gas delivery passage or between the gas delivery passage and the vaporizing space to trap mist contained in the generation gas, and an infrared irradiation mechanism configured to irradiate the filter with infrared rays.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
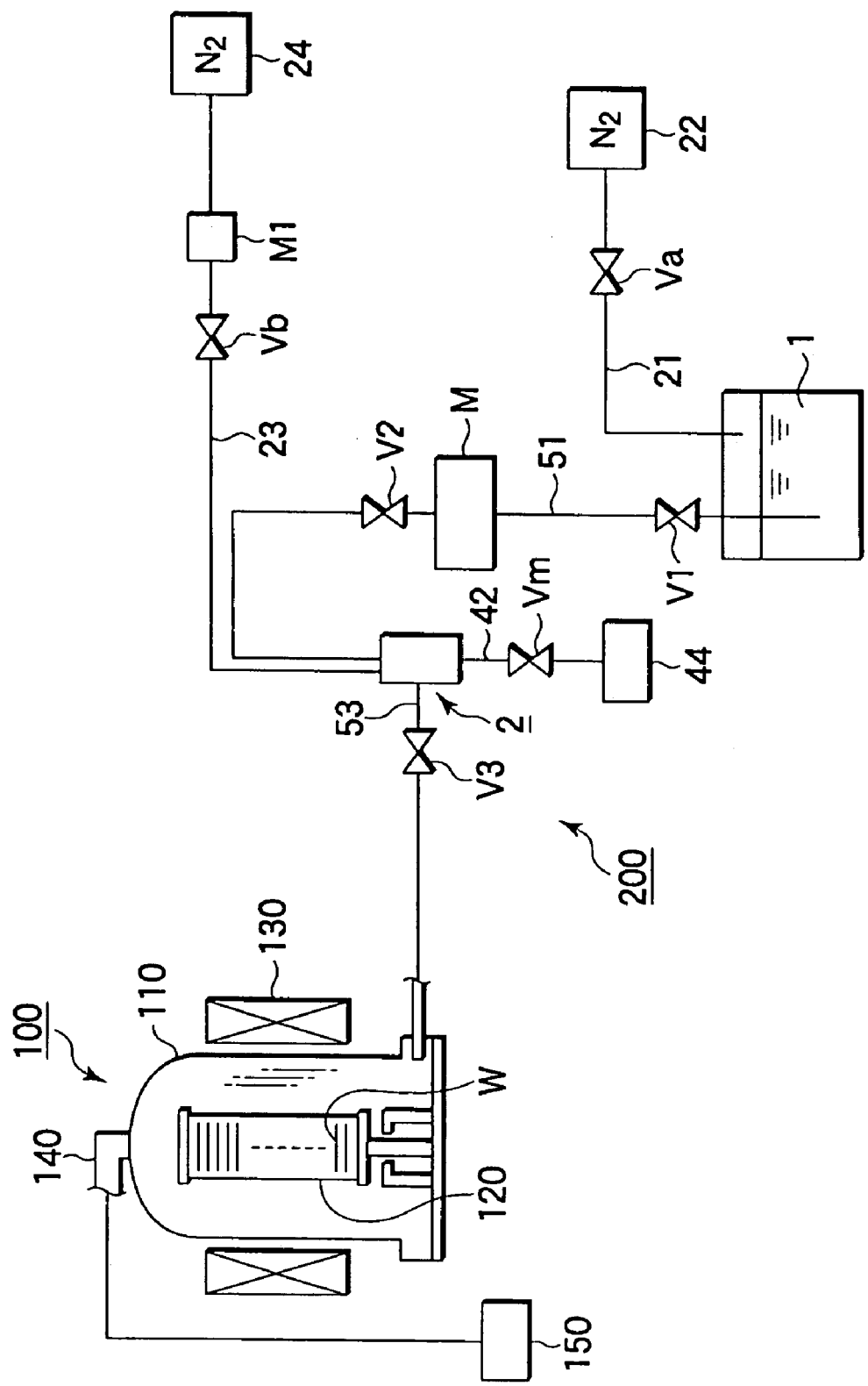
FIG. 1 is a structural view showing a semiconductor processing system (film formation system) including a vaporizing apparatus according to an embodiment of the present invention.

In the process of developing the present invention, the inventors studied problems concerning conventional vaporizers and vaporizing systems. As a result, the inventors have arrived at the findings given below.

In the case of a vaporizer of the type disclosed in Patent Document 1, when a process gas passes through a filter, mist deposited on the filter evaporates and takes heat from the filter due to the evaporation heat, so the temperature of the filter is decreased. Although the filter is heated by a heater, heat cannot be sufficiently transmitted within the filter from the peripheral portion to the central portion, because the filter is made of a metal sintered body or fibers. The temperature at the central portion of the filter is thus decreased, and can be hardly returned to a predetermined temperature. If mist is deposited on the filter without evaporation, the filter is clogged earlier and shortens its service life.

On the other hand, if the temperature of the central portion of the filter is set higher by increasing the output to the heater, the temperature at the peripheral portion of the filter becomes too high, and the liquid material is thereby denatured. For example, in the case of a liquid material that evaporates at 290 to 300° C., the liquid material is denatured if the temperature is increased by 5 to 10° C. therefrom. If the temperature of the central portion of the filter is set to be 290 to 300° C. by increasing the output to the heater, the temperature at the peripheral portion of the filter becomes far higher than that at the central portion. Consequently, the mist deposited on the peripheral portion is denatured.

Embodiments of the present invention achieved on the basis of the findings given above will now be described with reference to the accompanying drawings. In the following description, the constituent elements having substantially the same function and arrangement are denoted by the same reference numerals, and a repetitive description will be made only when necessary.

FIG. 1 is a structural view showing a semiconductor processing system (film formation system) including a vaporizing apparatus according to an embodiment of the present invention. This system includes a film formation section 100 configured to perform a predetermined film formation process on target substrates, such as wafers W, (to form a predetermined thin film on the wafers W). The film formation section 100 is connected to a gas supply system 200 configured to supply a predetermined process gas.

For example, the film formation section 100 comprises a low-pressure CVD apparatus of the batch type having a vertical reaction tube 110 used as a reaction chamber (process chamber). A wafer boat 120 supporting a number of wafers W can be loaded and unloaded into and from the reaction tube 110. A heater 130 is disposed around the reaction tube 110 to heat the wafers W. A vacuum pump 150 used as vacuum exhaust means is disposed to maintain the interior of the reaction tube 110 at a predetermined vacuum level. A predetermined process gas is supplied into the reaction tube 110 through a process gas supply line, as described later.

The gas supply system 200 includes a storage vessel 1, a vaporizing apparatus 2, and piping lines connected to them. The storage vessel 1 stores a liquid material having a low vapor pressure of, e.g., 0.55 Pa at 85° C., such as a hafnium-containing material, e.g., TEMAH (Tetrakis (N-ethyl-N-methylamino) hafnium) or HTB (hafnium tetra-t-butoxide). The vaporizing apparatus 2 is configured to vaporize a liquid material supplied from the storage vessel 1, so as to generate the process gas.

Specifically, the storage vessel 1 is connected to the vaporizing apparatus 2 through a supply line (liquid material supply passage) 51. The end of the supply line 51 at the storage vessel 1 is positioned in the liquid material within the storage vessel 1. The supply line 51 is provided with a first valve V1, a liquid mass flow meter M, and a second valve V2 in this order from the upstream side (from the storage vessel 1).

A gas supply line 21 provided with a valve Va is connected to the storage vessel 1. One end of the gas supply line 21 is positioned above the surface of the liquid material within the storage vessel 1. The other end of the gas supply line 21 is connected to a supply source 22 of a pressurized gas, such as $N_2$ gas. When the liquid material is supplied from the storage vessel 1 to the vaporizing apparatus 2, the storage vessel 1 is supplied with $N_2$ gas set at, e.g., about 1.0 kg/cm$^2$. The liquid material is sent and transported by pressure from the storage vessel 1 to the vaporizing apparatus 2 at a predetermined flow rate. The pressurized gas may be an inactive gas, such as helium (He) gas or argon (Ar) gas other than $N_2$ gas.

A supply source 24 of an assist gas used as a purge gas or atomizing gas, such as $N_2$ gas, is also connected to the vaporizing apparatus 2 through a gas supply line 23. The gas supply line 23 is provided with a first mass flow controller M1 and a valve Vb in this order from the gas supply source 24. With this arrangement, the assist gas or $N_2$ gas can be supplied to the vaporizing apparatus 2 at a predetermined flow rate. The assist gas may be an inactive gas, such as helium (He) gas or argon (Ar) gas other than $N_2$ gas.

Figure 2:
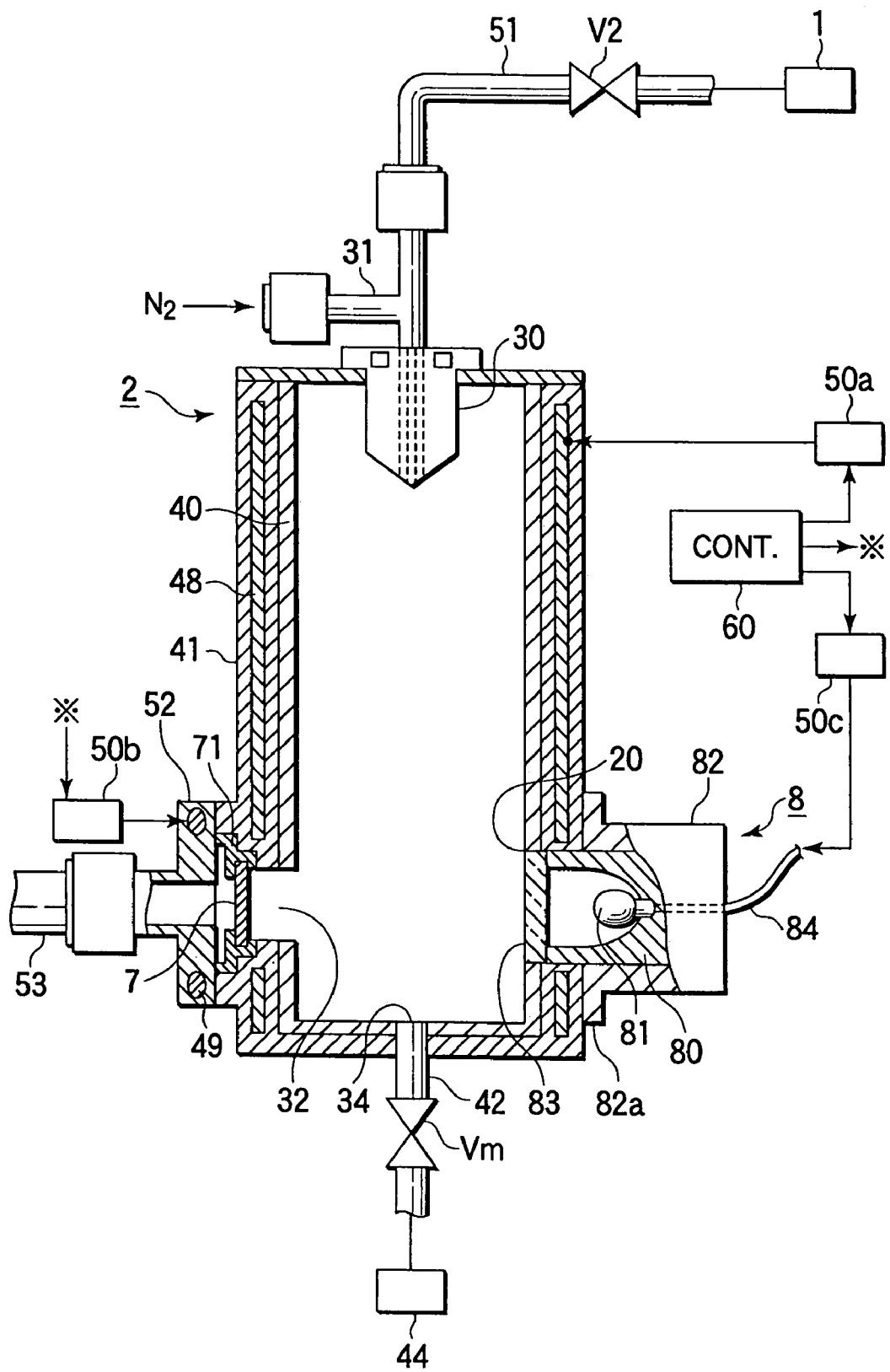
FIG. 2 is a sectional side view showing a vaporizing apparatus used in the system shown in FIG. 1.

FIG. 2 is a sectional side view showing the vaporizing apparatus 2 used in the system shown in FIG. 1. The vaporizing apparatus 2 includes a cylindrical and airtight vaporizing container 40 used as a main body for defining a vaporizing space, and a rectangular cover 41 covering the outer surface of the container 40. The container 40 is formed of a vertical cylinder of stainless steel, which has an inner diameter of 30 to 40 mm and a length of 250 mm, for example. An injector 30 is disposed on the central axis of the container 40 at the top, and is connected to the supply line 51. The injector 30 is of a spray type having a double tube structure formed of inner and outer tubes. The inner tube discharges a liquid material supplied from the supply line 51, while the outer tube discharges nitrogen gas used as an atomizing gas supplied from the supply line 23. The liquid material is delivered into the container 40 from a spray port 30a (having a hole diameter of, e.g., 0.1 mm) at the distal end of the injector 30 in an atomized state (as mist).

An output port 32 is formed in the sidewall of the container 40 near the bottom to output, in a lateral direction, a generation gas obtained by vaporizing liquid material. The output port 32 is connected through a port connector 52 to a gas supply line 53 for supplying a process gas into the film formation section. The port connector 52 is a part of a gas supply passage formed by the gas supply line 53. This gas supply passage (see a reference numeral 53 in FIG. 1) is connected to the film formation section 100 through a valve V3.

Figure 3:
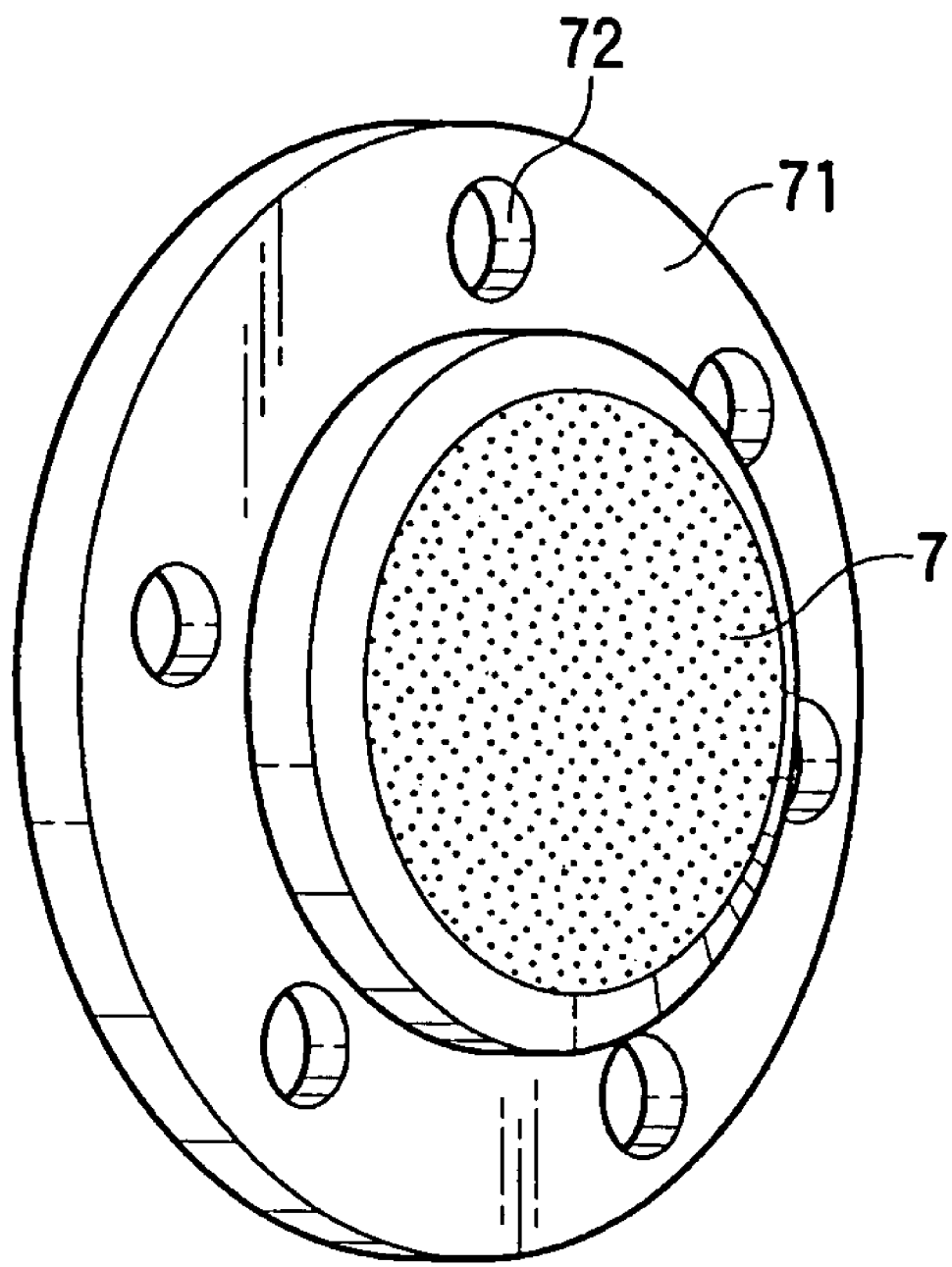
FIG. 3 is a perspective view schematically showing a filter built in the vaporizing apparatus shown in FIG. 2.

The container 40 is provided with a circular filter 7 that covers the output port 32 to trap mist. FIG. 3 is a perspective view schematically showing the filter 7. The filter 7 is mounted on a ring-like fixing member 71 to cover the central opening of the member 71. The fixing member 71 with the filter 7 mounted thereon is fixed to the cover 41 by bolts (not shown), which are inserted in bolt insertion holes 72 formed in the peripheral portion of the fixing member 71 and are screwed into the wall surface of the cover 41. The filter 7 is formed from a sintered metal body or fibers and has a thickness of, e.g., about 2 mm.

As shown in FIG. 2, an opening 20 is formed in the sidewall of the container 40 near the bottom at a position opposite to the filter 7. An infrared irradiation mechanism 8 is mounted on the opening 20 such that the front face of the mechanism 8 is fitted in the opening 20. The infrared irradiation mechanism 8 includes a cylindrical reflector 80 having a mirror finished inner surface. An infrared source, such as a halogen lamp 81, is disposed on the proximal end of the reflector 80. A transmission window 83 made of, e.g., quartz or kover glass is disposed to airtightly close the opening 20 and to cover the front face of the reflector 80.

The infrared irradiation mechanism 8 is arranged such that the optical axis of the halogen lamp 81 essentially aligns with the center of the filter 7. Accordingly, the infrared irradiation mechanism 8 takes on heating of an inner circular region separated from the peripheral edge of the filter 7 to some extent. The infrared irradiation mechanism 8 includes a fixing member 82 having a flange 82a. The fixing member 82 surrounds the reflector 80 and is integrated with the reflector 80 on the proximal end side. The flange 82a is fixed to the cover 41 of the vaporizing apparatus 2 by bolts, so that the infrared irradiation mechanism 8 is airtightly mounted on the cover 41.

The cover 41 contains a plurality of heaters 48 formed of, e.g., resistive heating bodies, which are disposed to extend in, e.g., the longitudinal direction of the container 40 and surround the container 40. In this embodiment, the heaters 48 consist of two heaters disposed near the output port 32 and two heaters disposed near the side opposite to the output port 32. Further, a heater 49 formed of, e.g., a resistive heating body is built in the port connector 52, which is mounted on the cover 41 to connect the output port 32 of the container 40 to the gas supply line (gas delivery passage) 53.

The heaters 48 and 49 of the vaporizing apparatus 2 are respectively connected to power supplies 50a and 50b, which are controlled by a control section 60. With this arrangement, the temperature of the inner surface of the vaporizing apparatus 2 and the temperature near the peripheral edge of the filter 7 can be respectively controlled to be predetermined values. The halogen lamp 81 of the infrared irradiation mechanism 8 is connected to a power supply 50c, which is also controlled by the control section 60. With this arrangement, the temperature at the central portion of the filter 7 can be controlled to be a predetermined value. In other words, according to this embodiment, the peripheral region of the filter 7 is heated by conductive heat from the heaters 48 and 49 and the central region thereof is heated by radiation heat from the infrared irradiation mechanism 8. The target temperature of the filter 7 heated by the heaters 48 and 49 and infrared irradiation mechanism 8 is set to be within a temperature range with which the liquid material is vaporized without being denatured.

The container 40 has a drain port 34 formed in the bottom to discharge non-vaporized part of the liquid material. The drain port 34 is connected to a discharge line 42, which is provided with a mist discharge valve Vm near the bottom of the container 40. When the valve Vm is closed, a mist receiver is formed near the drain port 34 to store mist. The other end of the discharge line 42 is connected to an exhaust pump 44 to suck and discharge mist, so a suction passage is defined by the discharge line 42 and exhaust pump 44.

Figure 4A:
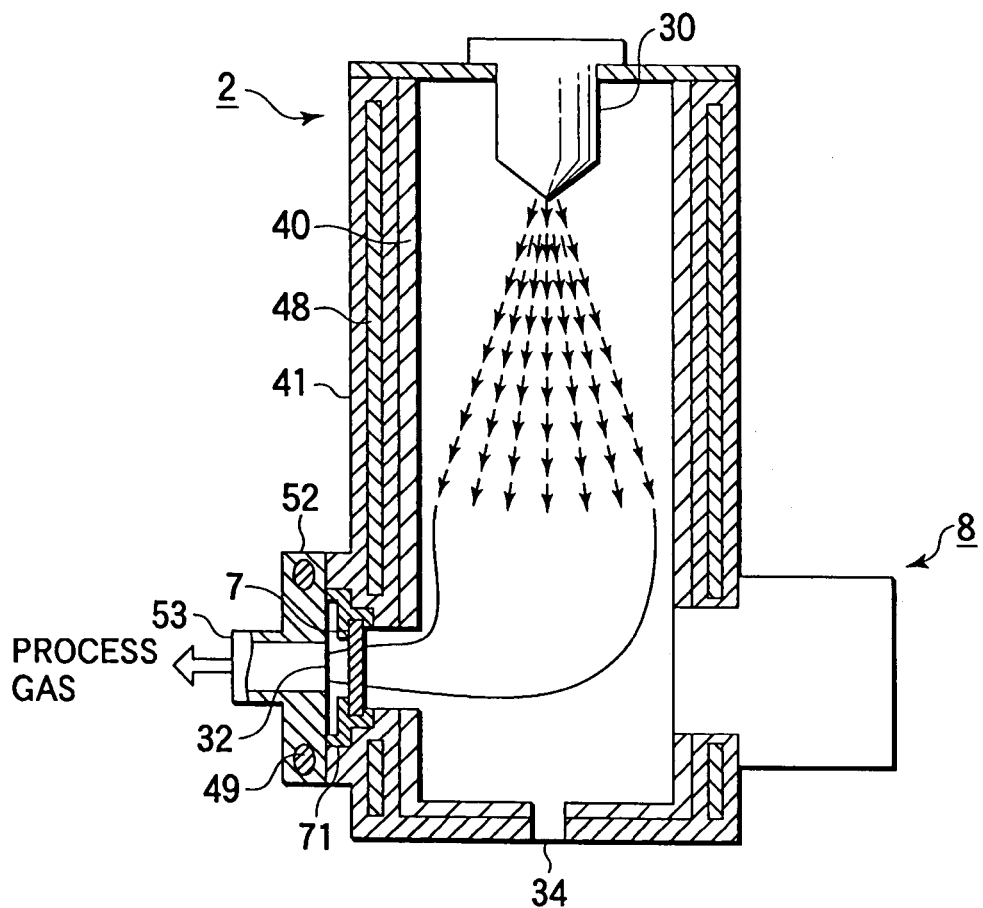
FIG. 4A is a view showing an image of a liquid material vaporizing method performed in the vaporizing apparatus shown in FIG. 2.
Figure 4B:
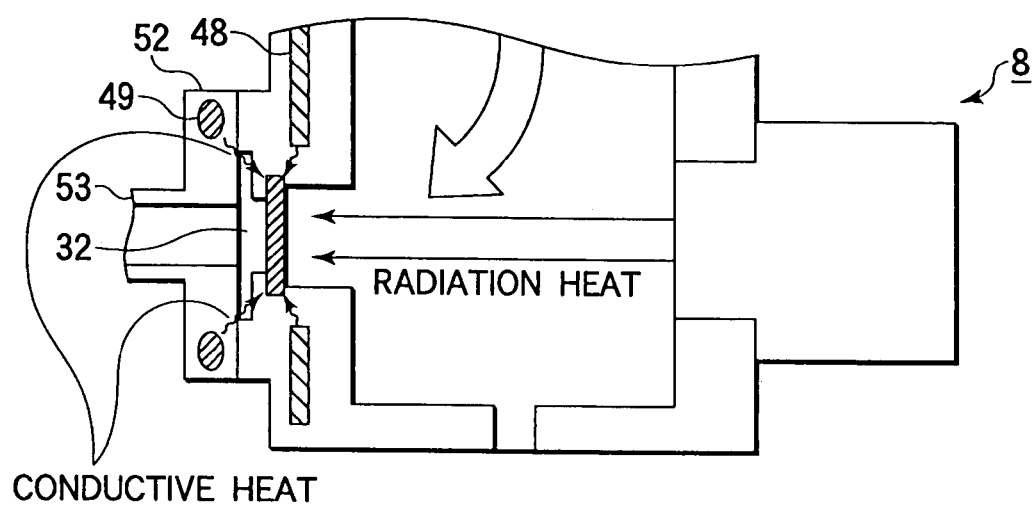
FIG. 4B is a view schematically showing the relationship between the filter and infrared irradiation mechanism in the vaporizing apparatus shown in FIG. 2.

Next, an explanation will be given of a film formation method performed in the film formation apparatus described above. FIG. 4A is a view showing an image of a liquid material vaporizing method performed in the vaporizing apparatus shown in FIG. 2. FIG. 4B is a view schematically showing the relationship between the filter and infrared irradiation mechanism in the vaporizing apparatus shown in FIG. 2;

Where a film formation process is performed, at first, the valve V1, V2, V3, and Va are set open. Specifically, the gas supply system 200 is operated such that $N_2$ gas used as a pressurized gas is supplied into the storage vessel 1 through the gas supply line 21. With this pressurized gas being supplied, the liquid material having a low vapor pressure, such as hafnium-containing liquid material, is sent by pressure from the storage vessel 1 through the supply line 51 to the vaporizing apparatus 2, at a flow rate controlled by the liquid mass flow meter M. At this time, the temperature of the liquid material flowing through the supply line 51 is set at, e.g., about 40° C. by a heater (not shown) disposed around the supply line 51.

On the other hand, in the film formation section 100, the interior of the reaction tube 110 is vacuum-exhausted to a predetermined vacuum level. Thus, the fluids can flow downstream through supply lines in the gas supply system 200 when the corresponding valves are opened. Thus, the vaporizing apparatus 2 is supplied with the hafnium-containing liquid material at a flow rate of, e.g., 5 sccm. At this time, the valve V3 of the output port 32 is set open, while the valve Vm of the drain port 34 is set closed, so a fluid flow bent from a vertical direction to a horizontal direction is formed within the container 40.

In the vaporizing apparatus 2, the interior of the container 40 is heated by the heaters 48 and 49 at, e.g., about 140° C. The liquid material is delivered downward from the injector 30 into the container 40 in an atomized state (as microparticles). The atomized liquid material is further uniformly atomized and partly vaporized by heating, while it is spreading conically at an upper side within the container 40. The material flow thus conically spread and containing vapor and mist (which is formed of particulate matters) is further vaporized by heat exchange while it flows downward within the container 40.

While the material flow is formed downward within the container 40, gas contained therein is drawn toward the film formation section 100 and is thereby bent from a vertical direction to a horizontal direction. On the other hand, mist mixed in the material flow does not change direction, but flows downward due to an inertia force based on its own large weight. Consequently, the mist is separated from the gas and is received by the mist receiver at the bottom of the container 40. However, even so, part of the mist may be not separated but contained in the material flow output from the output port 32. This part of the mist is trapped by the filter 7, when the material flow passes through the filter 7.

The peripheral portion of the filter 7 is heated by conductive heat from the heaters 48 and 49 through the cover 41 and fixing member 71 of the vaporizing apparatus 2. This heat is transmitted from the peripheral portion to the central portion, although the heat conductivity is low in the filter 7, as described above. Further, the central portion is irradiated with infrared rays and is thereby directly heated by radiation heat. Consequently, the filter 7 is maintained at a set temperature suitable for vaporizing mist, uniformly overall. The mist trapped by the filter 7 is thus vaporized and is mixed in the process gas, which flows through the filter 7 into the gas supply line 53. When the process gas passes through the filter 7 and the mist evaporates by use of evaporation heat, they take heat from the filter 7. However, the radiation heat of infrared rays immediately compensates for this heat, thereby maintaining the filter 7 at a set temperature, while the mist is continuously trapped and vaporized.

At this time, in the vaporizing apparatus 2, since the mist discharge valve Vm is set closed, non-vaporized particulate matters are accumulated at the drain port 34, as described above. After the film formation process, the valve Vm is opened and the exhaust pump 44 is operated at a predetermined timing, so that the mist pooled in the container 40 is discharged therefrom though the mist discharge line 42.

The process gas thus generated in the vaporizing apparatus 2 is supplied through the gas supply line 53 into the film formation section 100. At this time, the temperature of the process gas flowing through the supply line 53 is set at, e.g., about 150° C. by a heater (not shown) disposed around the gas supply line 53.

On the other hand, in the film formation section 100, a predetermined number of wafers W are placed on the boat 120, in advance. The boat 120 is loaded into the reaction tube 110 set at a predetermined temperature, and the interior of the reaction tube 110 is vacuum-exhausted to a predetermined vacuum level. After the interior of the reaction tube 110 is stabilized at a predetermined temperature and a predetermined pressure, the process gas generated by vaporization, such as a hafnium-containing material, and oxygen gas (not shown) are supplied into the reaction tube 110. Under these conditions, a film formation process is performed to form a hafnium oxide film on the wafers W.

According to the embodiment described above, the following effects are obtained. In the vaporizing apparatus 2, the peripheral portion of the filter 7 is heated by conductive heat from the heaters 48 and 49, and the central region of the filter 7 is heated by irradiation with infrared rays. In this case, the temperature of the filter 7 can be sufficiently recovered, so that the filter 7 is maintained at a set temperature suitable for vaporizing mist, as a whole. Since mist is efficiently vaporized, the filter 7 is prevented from being clogged with deposition of mist, so the service life of the filter is prolonged. Where the filter 7 is prevented from being clogged, the vaporizing operation can be kept stably performed for a long time without an increase in the pressure inside the container 40. Where the efficiency of vaporizing mist is high, the number of particles deposited on a wafer due to mist can be decreased. Consequently, along with a stable vaporizing operation, the film formation process can be kept stably performed for a long time.

Since the filter 7 is heated by radiation heat of infrared rays, the filter 7 is effectively heated under a vacuum atmosphere inside the container 40. The process gas obtained by vaporizing the liquid material is supplied through a passageway typically heated by a heater. In order to heat the filter 7, the irradiation area covered by the infrared irradiation mechanism 8 may be expanded to heat the entirety of the filter by irradiation with infrared rays.

Figure 5:
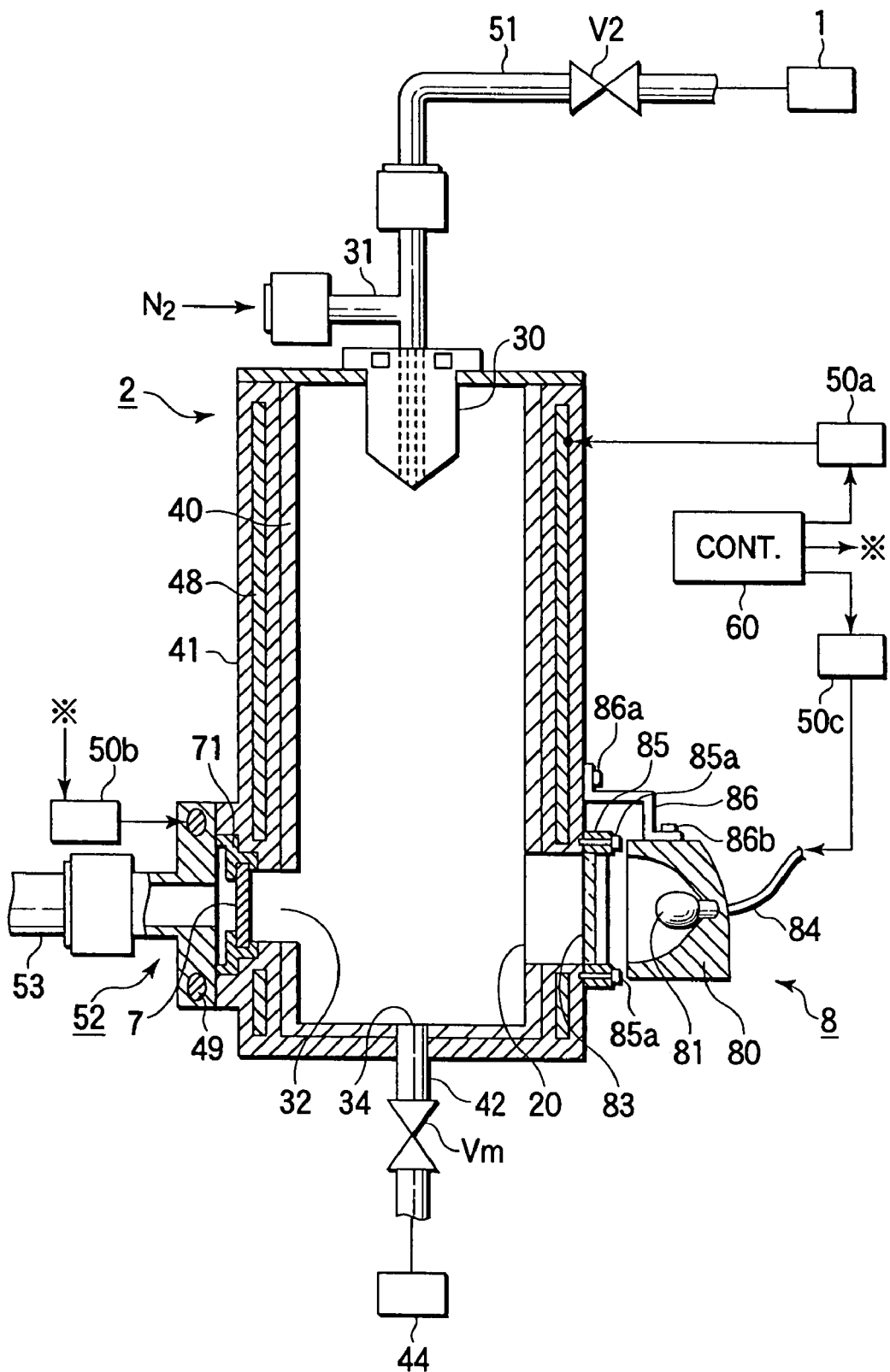
FIG. 5 is a sectional side view showing a modification of the vaporizing apparatus shown in FIG. 2.

FIG. 5 is a sectional side view showing a modification of the vaporizing apparatus shown in FIG. 2. In this modification, an infrared irradiation mechanism 8 includes a transmission window 83, which is attached to the outer surface of a cover 41 by a fixing member 85. Further, reflector 80 is attached to the outer surface of the cover 41 by a fixing member 86. The infrared irradiation mechanism 8 is thus arranged to irradiate the upstream side surface of a filter 7 with infrared rays.

More specifically, the transmission window 83 is disposed as an exterior member to close an opening 20 formed in the sidewall of the container 40 near the bottom. The transmission window 83 is mounted on a ring-like fixing member 85 to cover the central opening of the member 85. The fixing member 85 is fixed to the cover 41 by bolts (not shown), which are inserted in bolt insertion holes (not shown) formed in the peripheral portion of the fixing member 85 and are screwed into the wall surface of the cover 41. The fixing member 86 has an L-shape and is disposed on the outer surface of the cover 41 to connect the reflector 80 on one side. The fixing member 86 is fixed to the cover 41 by bolts 86a, which are screwed into holes (not shown) on the other side thereof. The fixing member 86 is connected to the reflector 80 by bolts 86b, which are screwed into holes (not shown) formed in said one side thereof.

With this infrared irradiation mechanism 8 thus arranged, the filter 7 can be effectively heated, as in the former case. In this embodiment, the structure of the infrared irradiation mechanism 8 is not limited to those described above.

Figure 6:
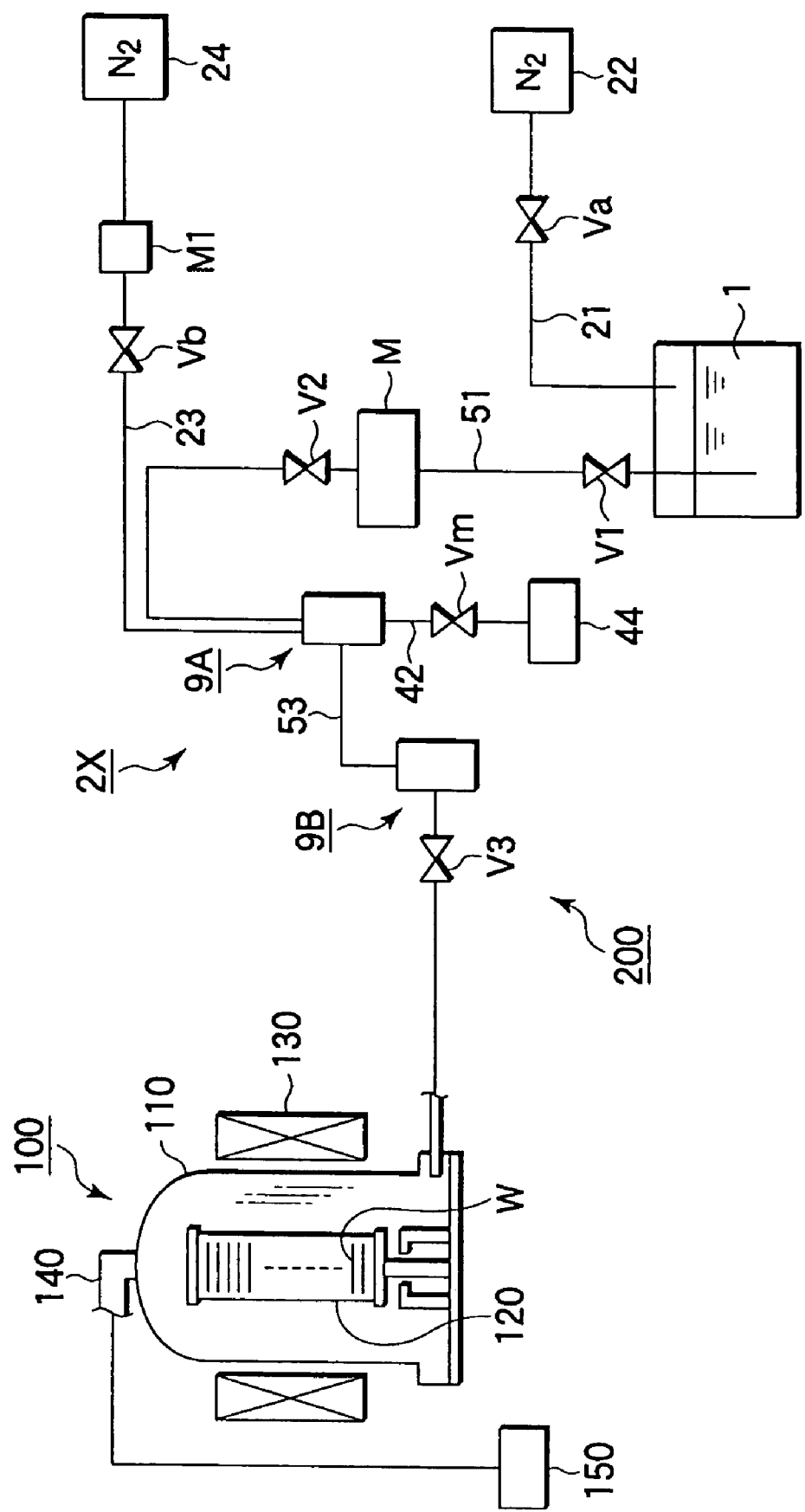
FIG. 6 is a structural view showing a semiconductor processing system (film formation system) including a vaporizing apparatus according to another embodiment of the present invention.

FIG. 6 is a structural view showing a semiconductor processing system (film formation system) including a vaporizing apparatus according to another embodiment of the present invention. A vaporizing apparatus 2X according to this embodiment includes a vaporizing unit 9A and a filter unit 9B separated from the vaporizing unit 9A and connected thereto through a gas supply line 53. The filter unit 9B is provided with a filter 7 and an infrared irradiation mechanism 8 structured as described above. In the other respects, the vaporizing apparatus 2X has the same structure as the vaporizing apparatus 2 according to the former embodiment.

Figure 7:
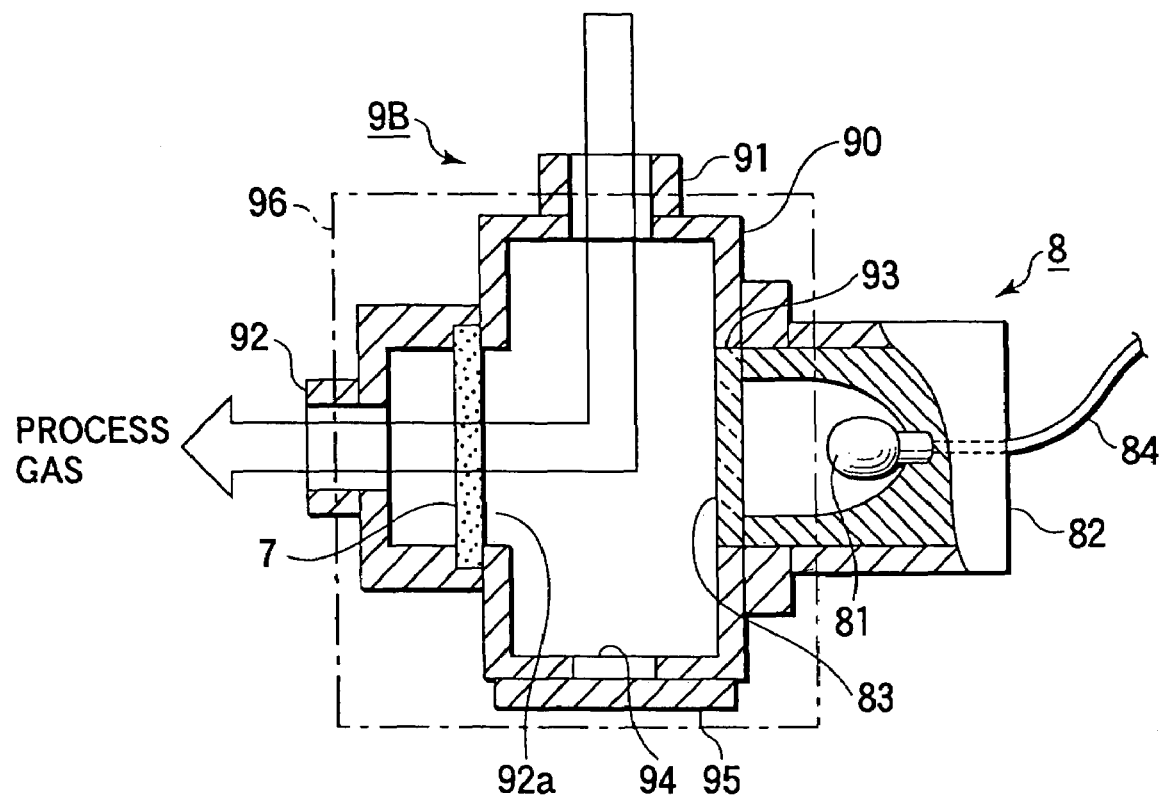
FIG. 7 is a sectional side view showing a filter unit of a vaporizing apparatus used in the system shown in FIG. 6.

As shown in FIG. 6, the gas supply line 53 extending from the vaporizing unit 9A is connected to the filter unit 9B. FIG. 7 is a sectional side view showing the filter unit 9B. The filter unit 9B includes a filter container 90 formed of a vertical cylinder having an inlet port 91 formed at the top. A process gas is supplied from the gas supply line 53 (not shown in FIG. 7) through the inlet port 91 into the filter container 90.

An outlet port 92 is formed on the sidewall of the filter container 90 near the bottom to supply the process gas to the film formation section 100. The filter 7 prepared as described above is built in the filter container 90 to cover the inner opening 92a of the outlet port 92. Although the structure for fixing the filter 7 is only schematically shown, the filter 7 is fixed to the filter container 90 by the fixing member 71 shown in FIG. 3, for example.

An infrared irradiation mechanism 8 structured as described above is disposed on the sidewall of the filter container 90. An opening 93 is formed in the sidewall of the filter container 90 at a position opposite to the filter 7. The front face of the infrared irradiation mechanism 8 is fitted in the opening 93. The filter 7 may be fixed to the filter container 90 by the same structure as that used in the vaporizing apparatus 2.

The filter unit 9B is provided with a heating block 96 that covers the filter container 90. Although the heating block 96 is only schematically shown with a chained line for the sake of simplicity, it includes a heater formed of a resistive heating body built in the block. The filter container 90, a part of the inlet port 91, and a part of the outlet port 92 are heated, so that portions to come into contact with the process gas are maintained at a temperature suitable for preventing the process gas from being liquefied and from being denatured. The peripheral portion of the filter 7 is heated by the heating block 96, and the central portion thereof is heated by infrared rays from the infrared irradiation mechanism 8.

The filter container 90 has a drain port 94 formed in the bottom to discharge non-vaporized part of a liquid material. The drain port 94 is airtightly sealed by a cap 95.

Next, an explanation will be given of an operation of this embodiment. In this embodiment, since the vaporizing unit 9A is not provided with the filter 7 or infrared irradiation mechanism 8, the process gas output from the output port of the vaporizing unit 9A contains vapor and non-vaporized particulate matters (mist) of a liquid material. The process gas is supplied through the gas supply line 53 and inlet port 91 into the filter container 90 and flows downward within the filter container 90.

Mist mixed in the process gas drops onto the bottom of the filter container 90 due to its own weight, and is separated from the process gas. The process gas is drawn by a suction force through the outlet port 92 and is thereby bent toward the outlet port 92. This process gas partly contains mist not separated by its own weight, so the mist is trapped by the filter 7 when the process gas passes through the filter 7. Consequently, as in the vaporizing apparatus 2 according to the former embodiment, the mist is vaporized and is mixed in the process gas, which flows through the filter 7 and then through the outlet port 92 and gas supply line 53 to the film formation section 100.

The vaporizing apparatus 2X according to this embodiment can provide a good filter function for a long time, as in the vaporizing apparatus 2 according to the former embodiment. Since mist is typically trapped on the upstream side surface of the filter 7, the infrared irradiation mechanism 8 is preferably disposed to face the upstream side surface in light of the heating efficiency. However, the infrared irradiation mechanism 8 may be disposed to face the downstream side surface of the filter 7.

Figure 8:
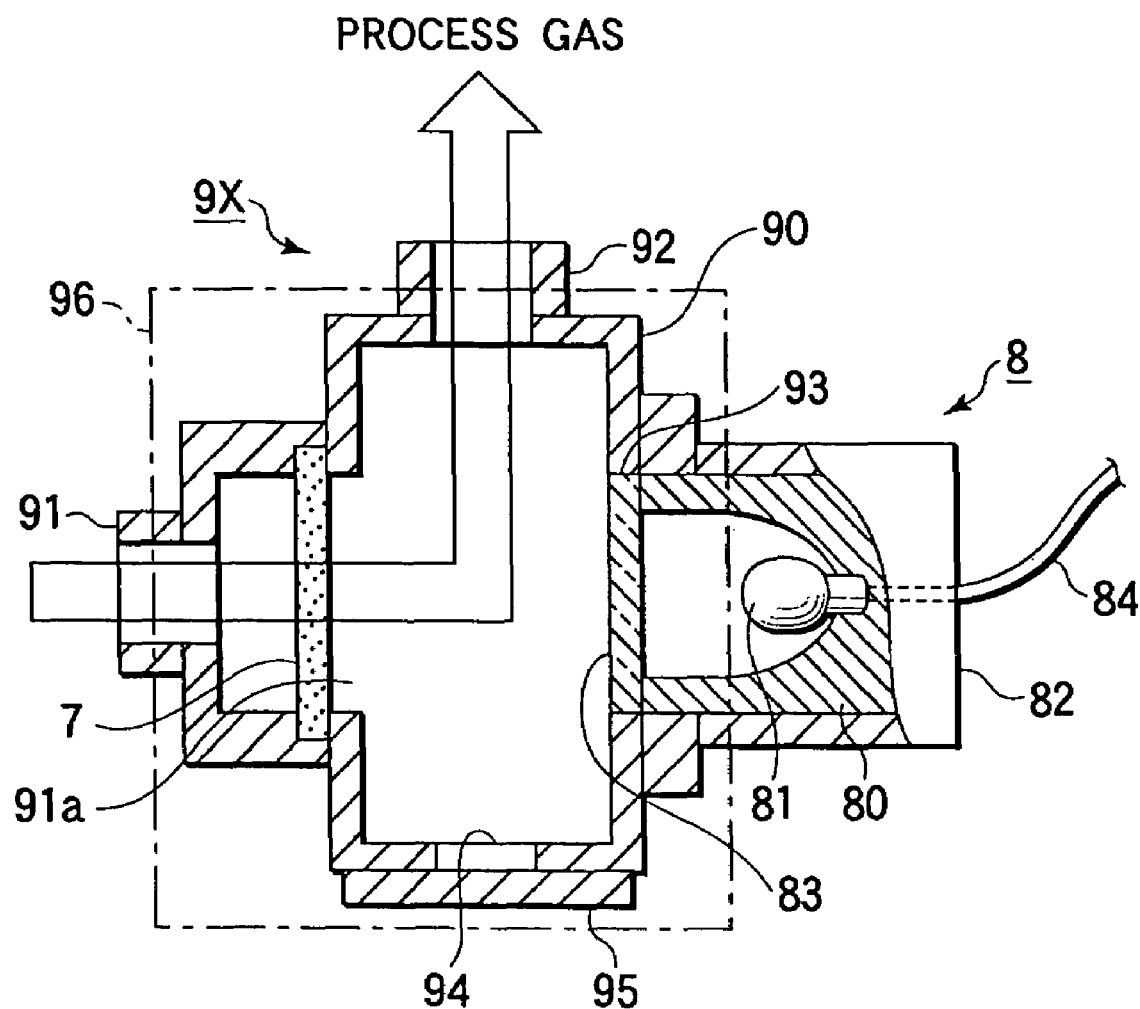
FIG. 8 is a sectional side view showing a modification of the filter unit shown in FIG. 7.

FIG. 8 is a sectional side view showing a modification of the filter unit shown in FIG. 7. This modification filter unit 9X has an inlet port 91 formed on the sidewall of the filter container 90 near the bottom and an outlet port 92 formed at the top of filter container 90. A filter 7 is built in the filter container 90 to cover the inner opening 91a of the inlet port 91. Also in this case, the central portion of the filter 7 is prevented from suffering a temperature decrease, thereby attaining the same effect.

According to the present invention, the liquid material having a low vapor pressure may be $Ta(OC_2H_5)_5$, which has a vapor pressure of 40 Pa or less at 140° C., or TDEAH $(HF[N(C_2H_5)]_4)$, which has a vapor pressure of 40 Pa or less at 120° C., other than a hafnium-containing material or HEAD. Further, the liquid material may be prepared by dissolving organic substances of titanium (Ti), strontium (Sr), and barium (Ba), i.e., metal organic substances, with tetrahydrofuran (THF) solution. The present invention may be applied to a process of using a process gas generated by vaporizing HEAD along with $NH_3$ gas to form a silicon nitride film, and a process of using a process gas generated by vaporizing $Ta(OC_2H_5)_5$ along with $O_3$ gas to form a $Ta_2O_5$ film. The film formation section may employ a film formation apparatus of the single-substrate type other than a low-pressure CVD apparatus of the batch type.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A vaporizing apparatus for generating a process gas from a liquid material, the apparatus comprising:
    a vaporizing container defining a vaporizing space of the vaporizing apparatus;
    an injector connected to the vaporizing container to spray the liquid material in an atomized state into the vaporizing space;
    a heater attached to the vaporizing container to heat the liquid material sprayed in the vaporizing space;
    a gas delivery passage connected to the vaporizing container to output from the vaporizing space a generation gas generated from the liquid material;
    a filter disposed inside the gas delivery passage or between the gas delivery passage and the vaporizing space to trap mist contained in the generation gas; and
    an infrared irradiation mechanism configured to irradiate the filter with infrared rays.

2. The vaporizing apparatus according to claim 1, wherein the infrared irradiation mechanism is configured to irradiate an upstream side surface of the filter with infrared rays.

3. The vaporizing apparatus according to claim 1, wherein the infrared irradiation mechanism is configured to irradiate the filter with infrared rays concentrically with the filter, and the vaporizing apparatus further comprises an assistant heater configured to heat a peripheral portion of the filter.

4. The vaporizing apparatus according to claim 1, wherein the filter and the infrared irradiation mechanism are attached to the vaporizing container.

5. The vaporizing apparatus according to claim 4, wherein the gas delivery passage is connected to a sidewall of the vaporizing container on a lower side to output the generation gas in a lateral direction.

6. The vaporizing apparatus according to claim 5, wherein the filter is mounted on an output port formed in a sidewall of the vaporizing container on one side corresponding to the gas delivery passage, and the infrared irradiation mechanism comprises a transmission window disposed in a sidewall of the vaporizing container on another side opposite to the output port, and an infrared source disposed outside the transmission window.

7. The vaporizing apparatus according to claim 4, wherein the injector is located at an upper side of the vaporizing container and configured to spray the liquid material downward in the vaporizing container.

8. The vaporizing apparatus according to claim 7, wherein the injector has a double tube structure formed of inner and outer tubes and configured to supply the liquid material from the inner tube and to supply an atomizing gas from the outer tube.

9. The vaporizing apparatus according to claim 1, wherein the vaporizing apparatus further comprises a filter container separated from the vaporizing container and disposed on the gas delivery passage to allow the generation gas to pass therethrough, and the filter and the infrared irradiation mechanism are attached to the filter container.

10. The vaporizing apparatus according to claim 9, wherein the filter is mounted on an outlet port for the generation gas formed in a sidewall of the filter container on one side, and the infrared irradiation mechanism comprises a transmission window disposed in a sidewall of the filter container on another side opposite to the outlet port, and an infrared source disposed outside the transmission window.

11. A semiconductor processing system comprising:
a process chamber configured to accommodate a target substrate;
a support member configured to support the target substrate inside the process chamber;
a heater configured to heat the target substrate inside the process chamber;
an exhaust system configured to exhaust gas from inside the process chamber; and
a gas supply section configured to supply a process gas into the process chamber, and including a vaporizing apparatus for generating the process gas from a liquid material,
wherein the vaporizing apparatus comprises
a vaporizing container defining a vaporizing space of the vaporizing apparatus,
an injector connected to the vaporizing container to spray the liquid material in an atomized state into the vaporizing space,
a heater attached to the vaporizing container to heat the liquid material sprayed in the vaporizing space,
a gas delivery passage connected to the vaporizing container to output from the vaporizing space a generation gas generated from the liquid material,
a filter disposed inside the gas delivery passage or between the gas delivery passage and the vaporizing space to trap mist contained in the generation gas, and
an infrared irradiation mechanism configured to irradiate the filter with infrared rays.

12. The system according to claim 11, wherein the infrared irradiation mechanism is configured to irradiate an upstream side surface of the filter with infrared rays.

13. The system according to claim 11, wherein the infrared irradiation mechanism is configured to irradiate the filter with infrared rays concentrically with the filter, and the vaporizing apparatus further comprises an assistant heater configured to heat a peripheral portion of the filter.

14. The system according to claim 11, wherein the filter and the infrared irradiation mechanism are attached to the vaporizing container.

15. The system according to claim 14, wherein the gas delivery passage is connected to a sidewall of the vaporizing container on a lower side to output the generation gas in a lateral direction.

16. The system according to claim 15, wherein the filter is mounted on an output port formed in a sidewall of the vaporizing container on one side corresponding to the gas delivery passage, and the infrared irradiation mechanism comprises a transmission window disposed in a sidewall of the vaporizing container on another side opposite to the output port, and an infrared source disposed outside the transmission window.

17. The system according to claim 14, wherein the injector is located at an upper side of the vaporizing container and configured to spray the liquid material downward in the vaporizing container.

18. The system according to claim 17, wherein the injector has a double tube structure formed of inner and outer tubes and configured to supply the liquid material from the inner tube and to supply an atomizing. gas from the outer tube.

19. The system according to claim 11, wherein the vaporizing apparatus further comprises a filter container separated from the vaporizing container and disposed on the gas delivery passage to allow the generation gas to pass therethrough, and the filter and the infrared irradiation mechanism are attached to the filter container.

20. The system according to claim 19, wherein the filter is mounted on an outlet port for the generation gas formed in a sidewall of the filter container on one side, and the infrared irradiation mechanism comprises a transmission window disposed in a sidewall of the filter container on another side opposite to the outlet port, and an infrared source disposed outside the transmission window.

* * * * *